United States Patent [19]

Verse et al.

[11] 4,451,822

[45] May 29, 1984

[54] DEVICE FOR AUTOMATICALLY CHECKING A PLURALITY OF ELECTRIC INDICATOR LIGHTS

[75] Inventors: Bernard P. Verse, Blagnac; Alain Y. Geoffroy, Tournefeuille; Pierre Gentet, Colomiers, all of France

[73] Assignee: Societe Nationale Industrielle Aerospatiale, Paris, France

[21] Appl. No.: 296,365

[22] Filed: Aug. 26, 1981

[30] Foreign Application Priority Data

Sep. 17, 1980 [FR] France ............................ 80 19997

[51] Int. Cl.$^3$ ............................................. G08B 21/00
[52] U.S. Cl. .................................. 340/642; 315/135; 340/516

[58] Field of Search ............... 340/641, 642, 715, 516; 315/129, 130, 135, 136

[56] References Cited

U.S. PATENT DOCUMENTS 4,307,392 12/1981 Loshbough et al. ................ 340/715

Primary Examiner—John W. Caldwell, Sr.
Assistant Examiner—Daniel Myer
Attorney, Agent, or Firm—Merriam, Marshall & Bicknell

[57] ABSTRACT

The invention relates to a device for checking a plurality of indicator lights, wherein the intensity passing through each indicator light is sequentially measured and the measurements are compared with nominal intensities. The invention is more particularly applicable to the checking of the indicator lights of devices monitoring functional members.

9 Claims, 4 Drawing Figures

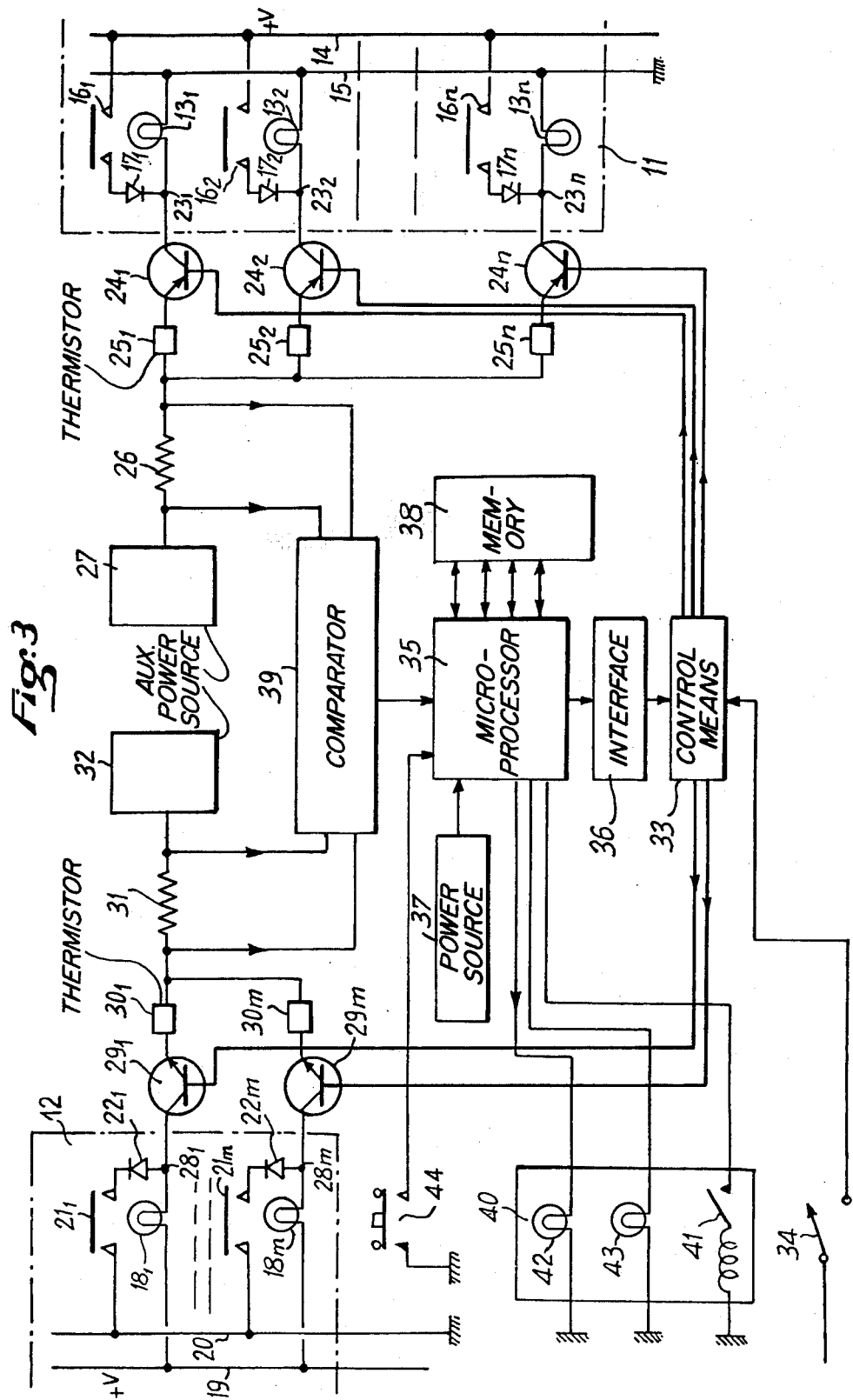

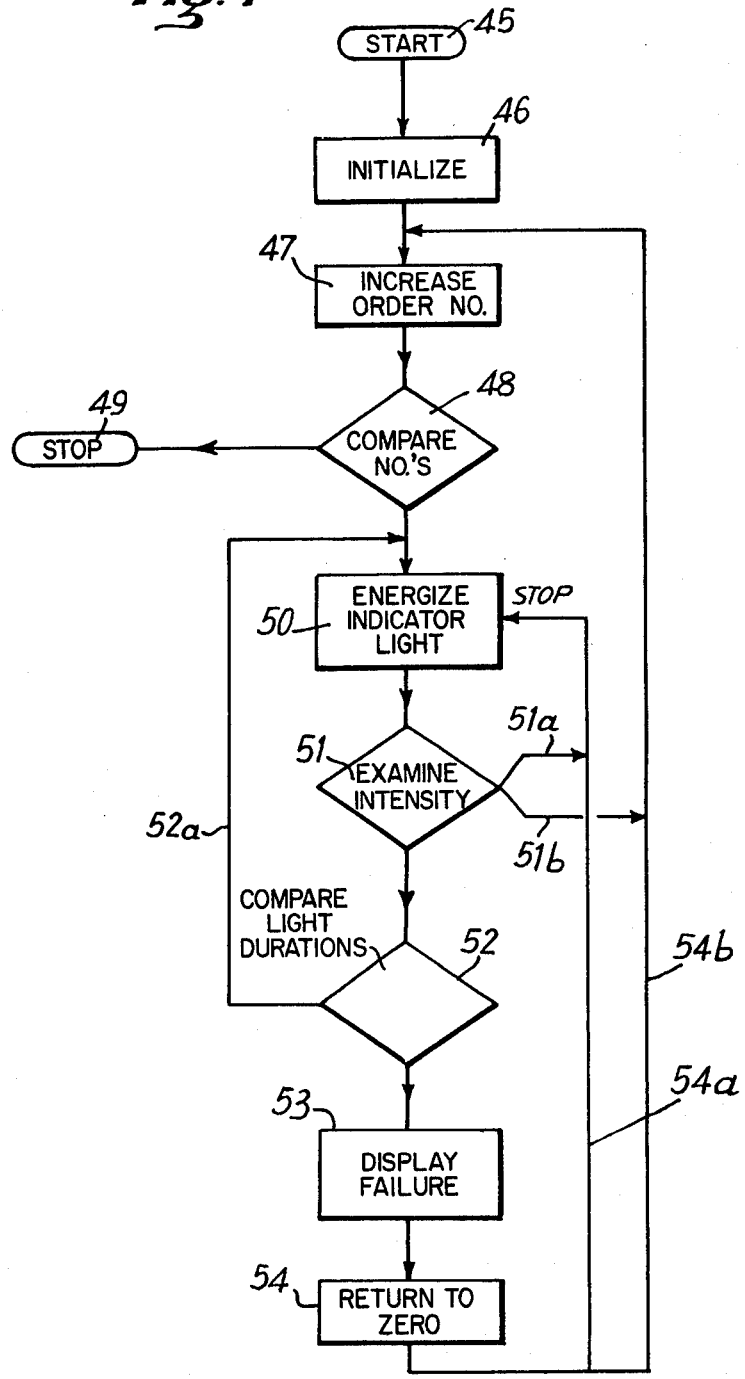

DEVICE FOR AUTOMATICALLY CHECKING A PLURALITY OF ELECTRIC INDICATOR LIGHTS

The present invention relates to a device for automatically checking a plurality of electric indicator lights.

In order to monitor correct functioning of different members of a machine, installation, aircraft, etc . . . , it is usual to associate an electric indicator light with each of said members which it is desired to monitor.

Each indicator light is disposed in an electrical circuit controlled by a contact whose state, closed or open, is controlled by the state of the corresponding member. Thus, a relationship is established between the state of the indicator light and that of the associated member, with the result that, by looking at said indicator light, it is possible to know whether the monitored member is functioning correctly or, on the contrary, whether it has broken down. As far as possible, in order to centralise monitoring and to simplify the electrical circuits, on the one hand at least most of the indicator lights are physically grouped together in an assembly, such as a board, and, on the other hand, similar indicator lights are electrically mounted in parallel at the terminals of a known source of supply, via the associated contacts.

Of course, the quality of the monitoring of functional members by such indicator lights depends on the functional quality of said lights. It is therefore necessary to check said indicator lights from time to time.

To this end, a checking device is already known, which essentially comprises an auxiliary source of supply, a switch and a plurality of outputs in parallel, each constantly connected to the circuit of one of said indicator lights, so that, when said switch is closed, it is possible simultaneously to supply all said indicators via said auxiliary supply source.

Such a known checking device presents drawbacks. Firstly, if all the indicator lights are lit up at the moment of checking, the observer will be dazzled and may possibly not detect a defective indicator light amongst others which are functioning normally. This is all the more so when an indicator light comprises a plurality of light elements (for example incandescent lamp bulbs) and when only one of these elements is defective. The resulting drop in illumination may not be visible and the indicator light is then considered as normal, whilst one of its light elements is already out of action. This difficulty in assessing the illumination of the indicator lights is further increased when each indicator light comprises a translucent surface comprising an inscription through which the light passes. Moreover, it is particularly tedious and tiring to check each indicator light in turn, when the number of indicator lights is high (for example from 400 to 500 on a control panel in an aircraft), with the result that, by weariness, the observer may unwittingly pass a defective indicator light as good.

Furthermore, in order to ensure insulation between the circuit supplying the indicator lights and the checking device, it is necessary to dispose a diode in each supply circuit and a diode at each output of the checking device, with the result that, for each indicator light, two diodes must be provided. This results in that such a known checking device can be used only for a limited number of indicators lights. Moreover, the failure (short-circuiting) of a diode of the checking device may cause the parasitic supply of other indicator lights, not concerned, when one of the indicator lights is supplied normally which disturbs monitoring of the functioning of the members and may lead to the decision for a general closed-down of the installation, machine, aircraft, etc . . . , for a non-justified reason which is difficult to identify.

It is an object of the present invention to remedy these drawbacks. To this end, according to the invention, the device for checking a plurality of electric indicator lights, each mounted in a supply circuit provided with a diode, and which comprises an auxiliary supply source and a plurality of outputs in parallel, each of which is connected to one of said supply circuits, between the corresponding indicator light and diode, is noteworthy in that each of said outputs comprises a controlled switch, in that control means are provided for actuating said controlled switches one after the other, and in that means mesure the intensity of the electric current passing through the indicator lights, whenever one of said lights is supplied by said auxiliary supply source via the corresponding controlled switch.

Thus, from the value of the intensity measured, the functional quality of each of said indicator lights may be deduced without having to observe them visually. In fact, the nominal intensity passing through each indicator light during normal functioning is known and it suffices to check, with the aid of comparison means, whether the measurement effected corresponds, to within a tolerance, to this nominal value to know whether the indicator light is out of action, able to operate normally, or partially defective. It will be readily appreciated that, due to the check of the indicator lights by measuring the intensity which passes through them, the device according to the invention allows both indicator lights with one light element and those with a plurality of lights elements, to be checked.

The measuring means are preferably common to all the indicator lights and the control means actuate a controlled switch with a view to measuring the intensity passing through the associated indicator light, only after checking the fact that the measurement of intensity corresponding to the preceding indicator light is normal, i.e. is equal to said nominal value, to within the tolerance.

The controlled switches, their control means, the measuring means and the comparison means advantageously function sequentially, monitored by a microprocessor, which may partially constitute at least certain of said means.

The controlled switches may be mounted in parallel and connected to the auxiliary source of supply by a calibrated resistor, which detects the intensity passing through the said indicator lights and of which the voltage at the terminals is transmitted to said microprocessor. Thus, the latter may compare a pending measurement with the corresponding nominal value, stored in a memory associated therewith In the event of the controlled switches being transistors, it is particularly advantageous to associate with each of them a thermistor with positive temperature coefficient to protect it against over-currents particularly in the event of an indicator light short-circuiting.

In order to allow the indicator lights to be checked, even when certain of them are lit up, the voltage of the supply source is of the same polarity as, but greater (in absolute value) than the voltage of the supply circuit in which each indicator light is located. In this way, if checking is effected whilst an indicator light is lit up, the corresponding diode is entirely blocked and all the current is shunted in the check device. The resulting excess voltage in the corresponding indicator light is not detrimental, as checking by measuring intensity is very short. This check may last only a few milliseconds, but the measurement of intensity must be effected only after stabilisation of the current in the indicator light. The measured current corresponds to the value imposed by the voltage of the auxiliary supply source and not to the normal value of use under the nominal voltage of the supply circuit, these two values being, in any case, very close.

Said control means comprise a circuit for controlling the switches which is normally controlled by the microprocessor, but which may also be controlled manually, particularly in the case of a defective microprocessor, in order to control all the indicator lights simultaneously upon lighting and to allow a general check. When the device according to the invention detects a functional abnormality in an indicator light, it causes the indicator lights which surround the defective light to blink, according to a program stored in the microprocessor.

The invention will be more readily understood on reading the following description with reference to the accompanying drawings, in which:

FIG. 1 schematically illustrates part of an assembly of indicator lights and the known device for checking same.

FIG. 3 is a block diagram of a checking device according to the invention.

FIG. 4 illustrates the functioning of the checking device of FIG. 3.

Figure 1:
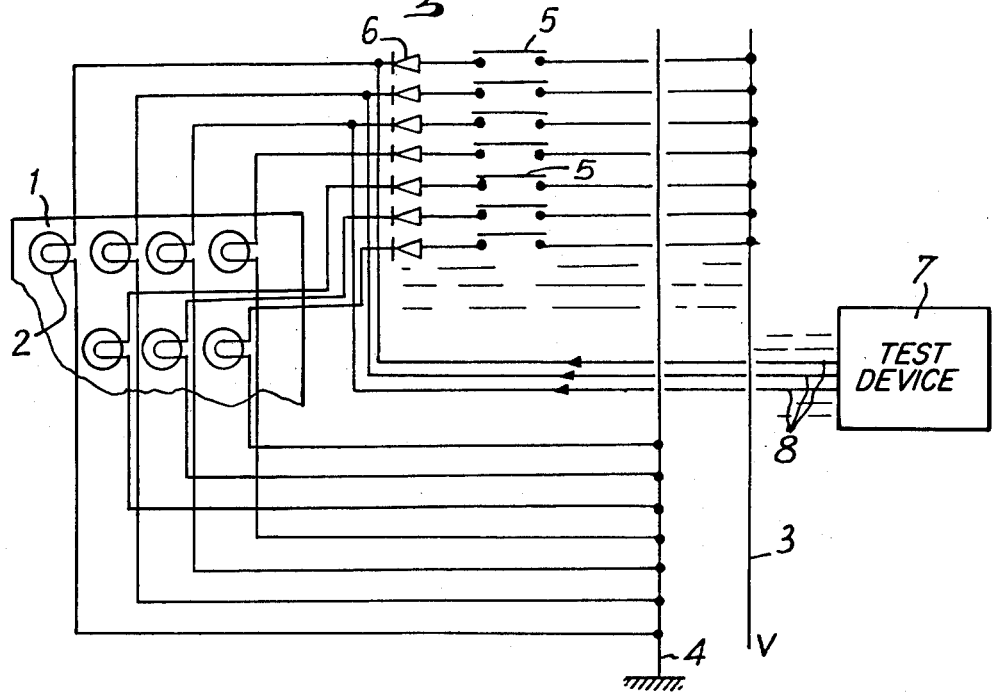

Referring now to the drawings, FIG. 1 shows part of a panel 1 on which a plurality of electric indicator lights 2 are grouped. Each indicator light 2 is connected in a circuit from a line 3 at potential V to an earth line 4, via a specific contact 5 and a diode 6 which allows circulation of the current between lines 3 and 4. Each contact 5 is controlled in synchronism with a member (not shown) of which it is desired to monitor functioning by monitoring the corresponding indicator light 2.

Figure 2:
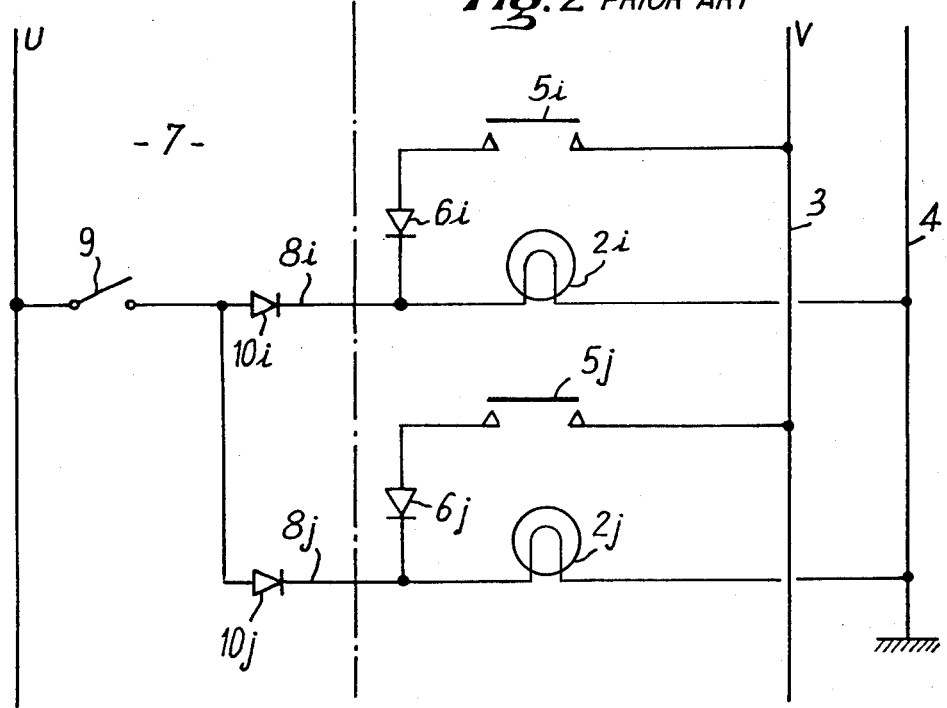
FIG. 2 illustrates the functioning of the known checking device of FIG. 1.

To check that the indicator lights 2 are functioning correctly, a device 7 is provided, comprising a source of voltage U (of the same polarity as voltage V) and a plurality of outputs 8, in parallel. Each output 8 is connected to a common point between a diode 6 and the corresponding indicator light 2. Moreover, as shown in FIG. 2, the device 7 comprises a switch 9 and each output 8 is provided with a diode 10, of which the direction of conduction corresponds to that of the associated diode 6. FIG. 2 shows two adjacent indicator lights 2, given indices i and j respectively. These same indices have been respectively applied to the references of the respective elements associated with said indicator lights.

To check all the indicator lights 2 of the panel 1 simultaneously, the switch 9 is closed. In this way, all the indicator lights 2 are lit simultaneously by the action of the voltage U (if a contact 5 is closed, it is the voltage V which supplies an indicator light, if its potential is higher than that of the voltage U).

In addition to the drawbacks of this known device, mentioned hereinabove, FIG. 2 shows that, if a diode 10, for example 10 i is deteriorated and short-circuits, the closure of the contact 5i (by its corresponding member and for a normal monitoring period of the panel 1) will light not only indicator light 2i, but also indicator light 2j (and others) through the short circuit 10i and diode 10j. This results in false indications on the panel 1, of which the cause is very difficult to identify and to correct.

The device according to the invention, shown in FIG. 3, is adapted to monitor two assemblies 11 and 12 of different indicator lights. In assembly 11, the different indicator lights $13_1$, $13_2$, ... $13_n$ are mounted between a line 14, at the positive potential $+V$, and an earth line 15, via respective contacts and diodes $16_1$, $17_1$ ... $16_2$, $17_2$ ... $16_n$, $17_n$. The diodes $17_1$ to $17_n$ are conductive from line 14 towards line 15, whilst the switches $16_1$ to $16_n$ are disposed between the line 14 and the indicator lights $13_1$ to $13_n$. In assembly 12, the different indicator lights $18_1$ to $18_m$ are mounted between a line 19, at positive potential $+V$, and an earth line 20, via respective contacts and diodes $21_1$, $22_1$ ... $21_m$, $22_m$. The diodes are conductive from line 19 towards line 20, whilst the switches $21_1$ to $21_m$ are disposed between line 20 and the indicator lights $18_1$ to $18_m$.

Thus, the indicator lights $13_1$ to $13_n$ may be said to be controlled by the $+V$, whilst the indicator lights $18_1$ to $18_m$ are controlled by earth.

Each point $23_1$ to $23_n$ common to a diode $17_1$ to $17_n$ and to an indicator light $13_1$ to $13_n$ is connected to the emitter-collector path of a transistor $24_1$ to $24_n$. Each of these emitter-collector paths is connected, via a thermistor $25_1$ to $25_n$ with positive temperature coefficient and a common calibrated resistor 26, to an auxiliary source 27 adapted to deliver a voltage slightly greater than $+V$; for example, if the voltage $+V$ is equal to $+28$ volts, the voltage of the auxiliary source 27 may be equal to $+32$ volts.

Similarly, each point $28_1$ to $28_m$ common to a diode $22_1$ to $22_m$ and to an indicator light $18_1$ to $18_m$ is connected to the emitter-collector path of a transistor $29_1$ to $29_m$. Each of these emitter-collector paths is connected, via a thermistor $30_1$ to $30_m$ with positive temperature coefficient and a common calibrated resistor 31, to an auxiliary source 32 capable of delivering a voltage slightly lower than the zero of earth; for example, the voltage of the auxiliary source 32 may be equal to $-4$ volts.

The bases of the transistors $24_1$ to $24_n$ and $29_1$ to $29_m$ are selectively connected to a control circuit 33, adapted to control the conduction or non-conduction of said transistors.

This control circuit 33 may itself be actuated, via either a contact 34 or a microprocessor 35, through an interface device 36. The microprocessor 35, for example of the MOTOROLA 6802 type, is supplied by a source 37 and is associated with a memory 38. Furthermore, it receives via a measuring device 39 the voltages at the terminals of the resistors 26 and 31. The microprocessor is provided with a control box 40, equipped with a push member 41 and two indicator lights 42 and 43. A switch 44 also controls the microprocessor 35.

If the contact 34 is closed, the microprocessor 35 not being supplied, the control circuit 33 renders all the transistors $24_1$ to $24_n$ and $29_1$ to $29_m$ conducting, so that all the indicator lights $13_1$ to $13_n$ and $18_1$ to $18_m$ are lit. It is then possible to check said indicator lights in similar fashion to that allowed by the known device 7 of FIGS. 1 and 2.

On the other hand, if the push element 41 (which may be of the magnetic hold type) is actuated, the switch 34 remaining open, the microprocessor 35 is controlled and the indicator light 43 lights up, indicating that the indicator lights are being checked automatically.

This "starting" phase is schematically shown by box 45 in the diagram of FIG. 4. During the initialisation phase 46, none of the transistors $24_1$ to $24_n$ or $29_1$ to $29_m$ is conducting, with the result that no current must circulate in the resistors 26 and 31. If this were not so, the process would stop there and the indicator light 42 would light up, indicating the abnormality.

If the microprocessor 35 is assured that, during phase 46, no current circulates in the resistors 26 or 31, it controls conduction of transistor $24_1$.

Thus, the auxiliary source 27 supplies the indicator light $13_1$ through the resistor 26, the thermistor $25_1$ and the transistor $24_1$. The current passing through the indicator light $13_1$ is converted by the resistor 26 into voltage which is applied to the device 39. The latter or the microprocessor 35 compares this voltage value with the nominal voltage allowed, taking into account the tolerances admissible. If the comparison indicates that the value of the voltage is abnormal, the microprocessor stops the process and causes two of the indicator lights $13_2$ to $13_n$ directly surrounding the defective indicator light $13_1$ to flash (via the circuit 33 and the corresponding transistors $24_1$). The observer can therefore immediately locate the defective indicator light. If, on the contrary, said comparison indicates that the value of the voltage is normal, the microprocessor stops the conduction of the transistor $24_1$ and renders transistor $24_2$ conductive, with the result that it now examines indicator light $13_2$ according to the same process.

Automatic checking therefore continues step by step up to indicator light $13_n$, after which indicator lights $18_1$ to $18_m$ are checked step by step.

Whenever a defective indicator light is detected, the process stops. However, it is possible to continue it, by actuating the switch 44 (for example after having replaced the defective indicator light).

The automatic functioning of the device according to the invention is shown schematically by the program of FIG. 4. After the start (box 45) and initialization (box 46) which corresponds to number 0 of the indicator lights, the order number of the indicator lights is increased by one unit (box 47) and the new number obtained is studied (box 48) by comparing it with the maximum number of indicator lights. If this new number is not less than the maximum number of indicator lights, the process is stopped (box 49). On the other hand, if this new number is less than the maximum number of indicator lights, the observer passes to the following operation which consists in lighting the indicator light corresponding to this new number (box 50). At 51, an examination is made as to whether the intensity is correct: if it is, lighting is stopped (link 51a) and one passes to the following indicator light (link 51b); if not, the lighting time is compared (box 52) with a predetermined duration which is long with respect to the lighting time corresponding normally to a measurement. If the lighting time is less than this duration, measurement restarts (link 52a); in the opposite case, failure is displayed (box 53) by flashing of the adjacent indicator lights. By acting on the switch 44, one returns to zero (box 54) by stopping all flashing (link 54a) and by passing to the following indicator light (link 54b).

It will be noted that the tests according to the invention may be carried out, even when certain indicator lights $16_1$ to $16_n$ or $18_1$ to $18_m$ are lit. In fact, as the sources 27 and 32 present voltages which, in absolute value, are greater than those of lines 14 or 20, the diodes $17_1$ to $17_n$ and $22_1$ to $22_m$ substantially block the flow of current from sources +V.

What is claimed is:

1. A device for checking a plurality of electric indicator lights connected in a plurality of parallel circuits across a common power supply, each circuit including one of said lights in series with a diode, said device comprising:
    a plurality of controlled switches each of which has one side adapted to be connected to one of said circuits at a point between said light and said diode;
    an auxiliary power source having a plurality of outputs, each output being connected to the other side of one of said switches in a circuit including the light associated with said one switch;
    control means for sequentially actuating said controlled switches;
    current measuring means for measuring the current flowing through each of said lights when its associated switch is closed to complete a circuit therethrough; and
    comparison means responsive to said current measuring means for comparing said measured current with a predetermined reference current corresponding to normal functioning of each said lamp.

2. A device in accordance with claim 1, further including a microprocessor for controlling and monitoring the sequential operation of said control means, said current measuring means, and said comparison means.

3. A device in accordance with claim 2 wherein said current measuring means is common to all of said lights and said control means is responsive to said comparison means to stop said sequential actuation of said switches when said comparison means measures a significant difference between a measured current and a corresponding reference current.

4. The device of claim 3 wherein said current measuring means comprises a calibrated resistor connected in series-parallel with all of said circuits including a controlled switch and an indicator light, the voltage generated across said resistor being supplied to said microprocessor as a measure of the current passing through any circuit in which said control switch is closed.

5. The device of claim 4 wherein said microprocessor is programmed to cause at least one indicator light adjacent an indicator light under test to flash by actuation of the controlled switch associated with said adjacent light, in the event that said comparison means indicates that said lamp under test is not functioning in a normal manner.

6. A device in accordance with claim 4 further including a plurality of thermistors with positive temperature coefficient, each thermistor being connected in series with one of said control switches.

7. A device in accordance with claim 1, wherein said auxiliary power source provides at the point of interconnection between a diode and an indicator light, a voltage sufficiently high to block said diode regardless of whether the controlled switch associated therewith is open or closed.

8. A device in accordance with claim 1 further including manually operable means associated with said control means for overriding said sequential operation of said control means and causing all of said switches to be actuated simultaneously.

9. A device of claim 8 wherein said simultaneous actuation of said switches causes said indicator lights to light simultaneously.

* * * * *